(12) United States Patent
Kim et al.

(10) Patent No.: US 10,910,412 B2
(45) Date of Patent: Feb. 2, 2021

(54) ETCHANT COMPOSITION, AND METHOD FOR MANUFACTURING METAL PATTERN AND ARRAY SUBSTRATE USING THE SAME

(71) Applicant: Samsung Display Co., Ltd., Yongin-si (KR)

(72) Inventors: Bong-Kyun Kim, Hwaseong-si (KR); Jinsuek Kim, Daejeon (KR); Seungbo Shim, Asan-si (KR); Shinhyuk Choi, Suwon-si (KR); Woonhyung Shim, Sejong-si (KR); Donghee Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 39 days.

(21) Appl. No.: 16/356,551

(22) Filed: Mar. 18, 2019

(65) Prior Publication Data
US 2019/0288015 A1    Sep. 19, 2019

(30) Foreign Application Priority Data
Mar. 19, 2018    (KR) .................. 10-2018-0031722

(51) Int. Cl.
| | | |
|---|---|---|
| H01L 27/12 | (2006.01) | |
| H01L 21/3213 | (2006.01) | |
| G02F 1/1362 | (2006.01) | |
| C09K 13/06 | (2006.01) | |
| C09K 13/08 | (2006.01) | |

(52) U.S. Cl.
CPC .......... *H01L 27/1244* (2013.01); *C09K 13/06* (2013.01); *C09K 13/08* (2013.01); *G02F 1/136286* (2013.01); *H01L 21/32134* (2013.01); *H01L 21/32139* (2013.01); *H01L 27/1288* (2013.01); *G02F 2001/136295* (2013.01); *H01L 27/124* (2013.01); *H01L 27/1259* (2013.01)

(58) Field of Classification Search
None
See application file for complete search history.

(56) References Cited

U.S. PATENT DOCUMENTS

| | | |
|---|---|---|
| 9,023,735 B2 | 5/2015 | Kim et al. |
| 9,546,321 B2 | 1/2017 | Barnes et al. |

(Continued)

FOREIGN PATENT DOCUMENTS

| | | |
|---|---|---|
| KR | 10-2004-0083157 | 10/2004 |
| KR | 10-1146099 | 5/2012 |

(Continued)

OTHER PUBLICATIONS

Derwent Abstract of WO2016042408,2016. (Year: 2016).*

*Primary Examiner* — Angel Roman
(74) *Attorney, Agent, or Firm* — H.C. Park & Associates, PLC (57) ABSTRACT

An etchant composition including a persulfate, a four-nitrogen ring compound, a carbonyl ring compound having two or more carbonyl groups, and water, and having a weight ratio of the four-nitrogen ring compound and the carbonyl ring compound of about 1:0.1 to about 1:2. The etchant composition may etch a multilayer of titanium/copper and may be used for manufacturing a metal pattern and an array substrate having excellent properties of an etched pattern.

18 Claims, 5 Drawing Sheets

(56) References Cited

U.S. PATENT DOCUMENTS 10,138,117 B2 11/2018 Chen et al.
2016/0032186 A1* 2/2016 Chen .......................... C23F 1/26
  252/79.3

FOREIGN PATENT DOCUMENTS

| KR | 10-2014-0019108 | | 2/2014 |
|----|-----------------|---|--------|
| KR | 10-2014-0132708 | | 11/2014 |
| KR | 10-2016-0037998 | | 4/2016 |
| KR | 10-1661072 | | 9/2016 |
| KR | 10-2017-0066299 | | 6/2017 |
| KR | 10-1745721 | | 6/2017 |
| WO | WO2016042408 | * | 3/2016 |

* cited by examiner

ETCHANT COMPOSITION, AND METHOD FOR MANUFACTURING METAL PATTERN AND ARRAY SUBSTRATE USING THE SAME

CROSS-REFERENCE TO RELATED APPLICATION

This application claims priority from and the benefit of Korean Patent Application No. 10-2018-0031722, filed on Mar. 19, 2018, which is hereby incorporated by reference for all purposes as if fully set forth herein.

BACKGROUND

Field

Exemplary embodiments of the present invention relate generally to an etchant composition and a method for manufacturing a metal pattern and an array substrate using the same and, more specifically, to an etchant composition provided for etching multiple metal layers and a method for manufacturing a metal pattern and an array substrate using the same.

Discussion of the Background

Large-size and 3D displays in the flat display industry have continually increasing high definition resolutions, which require rapid response rates. Particularly, in order to achieve increasing high definition resolutions, a decrease in the width of a metal pattern of a wire used in a circuit board of a display device is required. In this case, in order to control a resistance value, the height of the pattern increases, and accordingly, the likelihood of defects resulting from inferior step coverage of stacked metal layers increases.

As a metal pattern material, eco-friendly copper having excellent electrical conductivity is used, and to increase the adhesion with high resolution in a metal pattern using copper, a case of using another metal layer other than copper as a bottom layer is increasing. Accordingly, an etchant composition, which may maintain an appropriate taper angle, which is appropriate for patterning a multilayer including a copper layer and etch in a batch, is required.

The above information disclosed in this Background section is only for understanding of the background of the inventive concepts, and, therefore, it may contain information that does not constitute prior art.

SUMMARY

Exemplary embodiments of the present invention provide an etchant composition serving excellent taper properties during patterning a multilayer including copper.

Exemplary embodiments of the present invention also provide a method for manufacturing multiple metal patterns having an excellent taper shape. In addition, exemplary embodiments provide a method for manufacturing an array substrate, decreasing wiring defects, such as short-circuits, by forming multiple metal patterns having an excellent taper shape.

Additional features of the inventive concepts will be set forth in the description which follows, and in part will be apparent from the description, or may be learned by practice of the inventive concepts.

An exemplary embodiment of the inventive concept provides an etchant composition including from about 5 wt % to about 20 wt % of a persulfate; from about 0.1 wt % to about 2 wt % of a four-nitrogen ring compound; from about 0.01 wt % to about 3 wt % of a carbonyl ring compound having two or more carbonyl groups; and water. A weight ratio of the four-nitrogen ring compound and the carbonyl ring compound is from about 1:0.1 to about 1:2.

The etchant composition may further include from about 0.01 wt % to less than about 1 wt % of a three-nitrogen ring compound having a thiol group.

A weight ratio of the carbonyl ring compound and the three-nitrogen ring compound may be from about 1:0.2 to about 1:2.

The etchant composition may further include from about 0.1 wt % to about 5 wt % of a hydrogen sulfate.

The etchant composition may further include from about 0.01 wt % to about 2 wt % of a fluorine compound.

The etchant composition may further include from about 0.1 wt % to about 5 wt % of a sulfonic acid compound.

The etchant composition may further include from about 0.01 wt % to about 5 wt % of phosphoric acid or a phosphate.

The etchant composition may further include from about 0.01 wt % to about 2 wt % of a fluorine compound; from about 0.01 wt % to about 1 wt % of a three-nitrogen ring compound having a thiol group; from about 0.1 wt % to about 5 wt % of a hydrogen sulfate; is from about 0.1 wt % to about 5 wt % of a sulfonic acid compound; and from about 0.01 wt % to about 5 wt % of phosphoric acid or a phosphate, based on a total amount of the etchant composition.

The persulfate may include at least one of potassium persulfate ($K_2S_2O_8$), sodium persulfate ($Na_2S_2O_8$), or ammonium persulfate (($NH_4$)$_2S_2O_8$).

The four-nitrogen ring compound may include at least one of aminotetrazole, methyltetrazole, or mercaptomethyltetrazole.

The carbonyl ring compound may include at least one of thiazolidinedione, hydantoin, or succinimide.

The fluorine compound may include at least one of hydrogen fluoride (HF), ammonium fluoride ($NH_4F$), potassium fluoride (KF), sodium fluoride (NaF), ammonium bifluoride ($F_2H_5N$), potassium bifluoride ($KHF_2$), or sodium bifluoride ($NaHF_2$).

The three-nitrogen ring compound having a thiol group may include at least one of 3-mercapto-4-methyl-4H-1,2,4-triazole, 3-amino-1,2,4-triazole-5-thiol, or 1H-1,2,4-triazole-3-thiol.

The hydrogen sulfate may include at least one of ammonium hydrogen sulfate ($NH_4HSO_4$), lithium hydrogen sulfate ($LiHSO_4$), potassium hydrogen sulfate ($KHSO_4$), or sodium hydrogen sulfate ($NaHSO_4$).

The sulfonic acid compound may include at least one of methane sulfonic acid, benzene sulfonic acid, p-toluene sulfonic acid, ammonium sulfonic acid, amido sulfonic acid, a cyclic sulfonic acid compound, or a hydrocarbon-based sulfonic acid compound.

Another exemplary embodiment of the inventive concept provides a method for manufacturing a metal pattern including forming a photosensitive layer pattern on a multilayer including titanium and copper; providing the multilayer on which the photosensitive layer pattern is formed, with an etchant composition; and removing the photosensitive layer pattern. The etchant composition includes a persulfate, a four-nitrogen ring compound, a carbonyl ring compound having two or more carbonyl groups, and water, and a weight ratio of the four-nitrogen ring compound and the carbonyl ring compound is from about 1:0.1 to about 1:2.

The the multilayer may include a first metal layer including titanium; and a second metal layer disposed on the first metal layer and including copper, wherein the etchant composition etches the first metal layer and the second metal layer in a batch.

The etchant composition may further include a three-nitrogen ring compound having a thiol group, a hydrogen sulfate, a fluorine compound, a sulfonic acid compound, and phosphoric acid or a phosphate, and the etchant composition may include, based on a total amount of the etchant composition, from about 5 wt % to about 20 wt % of the persulfate; from about 0.1 wt % to about 2 wt % of the four-nitrogen ring compound; from about 0.01 wt % to about 3 wt % of the carbonyl ring compound; from about 0.01 wt % to about 2 wt % of the fluorine compound; from about 0.01 wt % to about 1 wt % of the three-nitrogen ring compound; from about 0.1 wt % to about 5 wt % of the hydrogen sulfate; from about 0.1 wt % to about 5 wt % of the sulfonic acid compound; from about 0.01 wt % to about 5 wt % of the phosphoric acid or the phosphate; and a remaining amount of the water.

Another exemplary embodiment of the inventive concept provides a method for manufacturing an array substrate including forming a gate line and a gate electrode, which is connected with the gate line, on a substrate; forming a data line, which crosses the gate line in an insulation state, a source electrode which is connected with the data line, and a drain electrode which is separated from the source electrode; and forming a pixel electrode, which is connected with the drain electrode. The forming of the gate line and the gate electrode, which is connected with the gate line, includes forming a photosensitive layer pattern on a multilayer including titanium and copper; providing the multilayer on which the photosensitive layer pattern is formed, with an etchant composition; and removing the photosensitive layer pattern. The etchant composition includes a persulfate, a four-nitrogen ring compound, a carbonyl ring compound having two or more carbonyl groups, and water, and a weight ratio of the four-nitrogen ring compound and the carbonyl ring compound is from about 1:0.1 to about 1:2.

The etchant composition may further include a three-nitrogen ring compound having a thiol group, a hydrogen sulfate, a fluorine compound, a sulfonic acid compound, and phosphoric acid or a phosphate, and the etchant composition may include, based on a total amount of the etchant composition, from about 5 wt % to about 20 wt % of the persulfate; from about 0.1 wt % to about 2 wt % of the four-nitrogen ring compound; from about 0.01 wt % to about 3 wt % of the carbonyl ring compound; from about 0.01 wt % to about 2 wt % of the fluorine compound; from about 0.01 wt % to about 1 wt % of the three-nitrogen ring compound; from about 0.1 wt % to about 5 wt % of the hydrogen sulfate; from about 0.1 wt % to about 5 wt % of the sulfonic acid compound; from about 0.01 wt % to about 5 wt % of the phosphoric acid or the phosphate; and a remaining amount of the water.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, an etchant composition according to an exemplary embodiment of the inventive concept will be explained.

The etchant composition according to an exemplary embodiment of the inventive concept may be used for etching a metal layer to form a metal pattern. The etchant composition may be used for etching a multilayer including copper (Cu) and titanium (Ti).

For example, the etchant composition may be used for etching a multilayer in which a titanium metal layer including titanium and a copper metal layer including copper are stacked to form a metal pattern. Particularly, the multilayer may be a double layer in which a titanium metal layer and a copper metal layer are stacked in order.

The etchant composition may include a persulfate, a four-nitrogen ring compound, a carbonyl ring compound having two or more carbonyl groups, a fluorine compound and water.

In the etchant composition of an exemplary embodiment, the persulfate is a main oxidant and may be an etchant for etching a metal layer including copper. However, an exemplary embodiment of the inventive concept is not limited thereto, and the persulfate may etch a metal layer including titanium.

The persulfate may be included in an amount of about 5 wt % to about 20 wt % based on the total amount of the etchant composition. For example, the persulfate may be included in an amount of about 10 wt % to about 20 wt % based on the total amount of the etchant composition. Particularly, the persulfate may be included in an amount of about 10 wt % to about 18 wt % based on the total amount of the etchant composition.

If the amount of the persulfate is greater than about 20 wt %, the etching rate of a metal layer using the etchant composition of an exemplary embodiment may be excessively fast, and the control of an etching degree may be difficult. Thus, a metal layer including copper may be overetched. In addition, if the amount of the persulfate is less than about 5 wt %, an etching rate may decrease, and etching may be carried out insufficiently.

The persulfate may be potassium persulfate ($K_2S_2O_8$), sodium persulfate ($Na_2S_2O_8$), or ammonium persulfate (($NH_4$)$_2S_2O_8$). The etchant composition of an exemplary embodiment may include at least one of the potassium persulfate, the sodium persulfate, or the ammonium persulfate as the persulfate. That is, the etchant composition may include any one, or two or more among the potassium persulfate, the sodium persulfate, and the ammonium persulfate as the persulfate.

The etchant composition of an exemplary embodiment includes a four-nitrogen ring compound. The four-nitrogen ring compound may prevent the corrosion of copper and may stably keep the surface profile of copper etched. The four-nitrogen ring compound means a compound including four nitrogen atoms among the atoms forming a ring.

The four-nitrogen ring compound may be included in an amount of about 0.1 wt % to about 2 wt % based on the total amount of the etchant composition. For example, the etchant composition may include the four-nitrogen ring compound in an amount of about 0.1 wt % to about 1 wt % based on the total amount of the etchant composition. Particularly, the etchant composition may include the four-nitrogen ring compound in an amount of about 0.2 wt % to about 0.7 wt % based on the total amount of the etchant composition.

If the amount of the four-nitrogen compound is greater than about 2 wt %, an etching rate may decrease due to the influence of the excessive amount of the four-nitrogen ring compound, and the processability of an etching process using the etchant composition of the inventive concept may decrease. In addition, if the amount of the four-nitrogen ring compound is less than about 0.1 wt %, the etching rate of a metal layer including copper may excessively increase, and the control of the etching degree of the metal layer may become difficult.

The four-nitrogen ring compound may be a substituted or unsubstituted tetrazole compound. For example, the four-nitrogen ring compound may be aminotetrazole, methyltetrazole, or mercaptomethyltetrazole. The etchant composition of an exemplary embodiment may include at least one of aminotetrazole, methyltetrazole, or mercaptomethyltetrazole as the four-nitrogen ring compound. That is, the etchant composition may include any one, or two or more among aminotetrazole, methyltetrazole, and mercaptomethyltetrazole as the four-nitrogen ring compound.

The etchant composition of an exemplary embodiment includes a carbonyl ring compound having two or more carbonyl groups. In the description, the carbonyl ring compound includes the carbon atom of a carbonyl group as a ring-forming carbon of a ring compound, and such carbonyl groups included in the ring-forming carbon are two or more. For example, the carbonyl ring compound may have two carbonyl groups, and particularly, may be a cyclic compound in which the carbon atoms of two carbonyl groups become ring-forming carbon atoms.

The carbonyl ring compound included in the etchant of an exemplary embodiment may play the role of a sulfate radical scavenger removing sulfate radicals produced during etching a copper metal layer. The persulfate included in the etchant of an exemplary embodiment produces sulfate radicals during etching a copper metal layer, and the produced sulfate radicals may attack and decompose the four-nitrogen ring compound. In addition, the decomposed four-nitrogen ring compound may be partially adsorbed on the copper metal layer to degrade the etching performance of the etchant composition. Accordingly, if the etchant composition of an exemplary embodiment includes the carbonyl ring compound, the carbonyl ring compound suppresses the decomposition of the four-nitrogen ring compound and may improve the etching performance of the etchant composition.

The carbonyl ring compound having two or more carbonyl groups may be included in an amount of about 0.01 wt % to about 3 wt % based on the total amount of the etchant composition. For example, the etchant composition may include the carbonyl ring compound in an amount of about 0.01 wt % to about 1 wt % based on the total amount of the etchant composition. Particularly, the etchant composition may include the carbonyl ring compound in an amount of about 0.01 wt % to about 0.5 wt % based on the total amount of the etchant composition.

If the amount of the carbonyl ring compound is greater than about 3 wt %, the carbonyl ring compound may be adsorbed onto a metal layer, and the etching performance of the etchant composition may decrease. In addition, if the amount of the carbonyl ring compound is less than about 0.01 wt %, the radical scavenger function of the carbonyl ring compound may be insufficient, the decomposition of the four-nitrogen ring compound in the etchant composition may not be suppressed, and the etching performance may decrease.

The carbonyl ring compound may be thiazolidinedione, hydantoin, or succinimide. The etchant composition of an exemplary embodiment may include at least one of the thiazolidinedione, the hydantoin, or the succinimide as the carbonyl ring compound. For example, the etchant composition may include any one, two, or more among the thiazolidinedione, the hydantoin, and the succinimide as the carbonyl ring compound.

In the etchant composition of an exemplary embodiment, the weight ratio of the four-nitrogen ring compound and the carbonyl ring compound may be about 1:0.1 to about 1:2. If the weight ratio of the four-nitrogen ring compound and the carbonyl ring compound is greater than about 1:0.1, the carbonyl ring compound may not play the role of a radical scavenger, and etching performance may be degraded. If the weight ratio of the four-nitrogen ring compound and the carbonyl ring compound is less than about 1:2, the adsorption properties of the carbonyl ring compound onto a metal layer may be intensified, and etching quality may be deteriorated.

The etchant composition of an exemplary embodiment includes a fluorine compound. The fluorine compound means a fluoride including a fluorine (F) atom. The fluorine compound may be an etchant for etching a metal layer including titanium. However, the inventive concept is not limited thereto, and the fluorine compound may etch a metal layer including copper.

The fluorine compound may be included in an amount of about 0.01 wt % to about 2 wt % based on the total amount of the etchant composition. For example, the etchant composition may include the fluorine compound in an amount of about 0.01 wt % to about 1 wt % based on the total amount of the etchant composition. Particularly, the etchant composition may include the fluorine compound in an amount of about 0.05 wt % to about 0.7 wt % based on the total amount of the etchant composition.

If the amount of the fluorine compound is greater than about 2 wt %, a metal layer including titanium may be over-etched, and undercut may be generated at the bottom of a metal layer including titanium, and an insulating layer or a substrate under the metal layer may be additionally etched. In addition, if the amount of the fluorine compound is less than about 0.01 wt %, the etching of a metal layer including titanium may become impossible.

The fluorine compound may be hydrogen fluoride (HF), ammonium fluoride ($NH_4F$), potassium fluoride (KF), sodium fluoride (NaF), ammonium bifluoride ($F_2H_5N$), potassium bifluoride ($KHF_2$), or sodium bifluoride ($NaHF_2$). The etchant composition may include at least one of hydrogen fluoride (HF), ammonium fluoride ($NH_4F$), potassium fluoride (KF), sodium fluoride (NaF), ammonium bifluoride ($F_2H_5N$), potassium bifluoride ($KHF_2$), or sodium bifluoride ($NaHF_2$) as a fluorine compound. For example, the etchant composition may include any one, or two or more among hydrogen fluoride (HF), ammonium fluoride (NH₄F), potassium fluoride (KF), sodium fluoride (NaF), ammonium bifluoride (F₂H₅N), potassium bifluoride (KHF₂), and sodium bifluoride (NaHF₂) as a fluorine compound.

The etchant composition of an exemplary embodiment may further include a three-nitrogen ring compound having a thiol group. The three-nitrogen ring compound means a compound in which three of the atoms forming a ring are nitrogen atoms. The etchant composition of an exemplary embodiment essentially includes a thiol group (—SH), and may include a three-nitrogen ring compound in which three of the atoms forming a ring are nitrogen atoms. The three-nitrogen ring compound may be a substituted or unsubstituted triazole compound. For example, the three-nitrogen ring compound may be a substituted or unsubstituted triazole compound and may include a thiol group as a substituent.

The three-nitrogen ring compound having a thiol group, which is included in the etchant composition of an exemplary embodiment, may play the role of an oxygen radical scavenger removing oxygen radicals produced during etching a copper metal layer. The persulfate included in the etchant composition of an exemplary embodiment produces oxygen radicals in addition to sulfate radicals during the etching process of a copper metal layer, and the produced oxygen radicals may attack and decompose the carbonyl ring compound. In addition, if the carbonyl ring compound is decomposed, the function as a sulfate radical scavenger for suppressing the decomposition of the four-nitrogen ring compound of the carbonyl ring compound may not be attained, and the etching performance of the etchant composition may decrease. That is, the etchant composition of an exemplary embodiment includes the three-nitrogen ring compound having a thiol group, and the decomposition of the carbonyl ring compound and the four-nitrogen ring compound may be prevented and etching performance may be improved.

The three-nitrogen ring compound may be included in an amount of about 0.01 wt % to about 1 wt % based on the total amount of the etchant composition. For example, the etchant composition may include the three-nitrogen ring compound in an amount of about 0.01 wt % to about 0.5 wt % based on the total amount of the etchant composition. Particularly, the etchant composition may include the three-nitrogen ring compound in an amount of about 0.02 wt % to about 0.4 wt % based on the total amount of the etchant composition.

If the amount of the three-nitrogen ring compound is greater than about 1 wt %, an excessive amount of the three-nitrogen ring compound may be adsorbed onto a metal layer to be etched, and the etching performance of the etchant composition may decrease. In addition, if the amount of the three-nitrogen ring compound is less than about 0.01 wt %, oxygen radicals produced during an etching process may not be removed, and the carbonyl ring compound and the four-nitrogen ring compound may be decomposed, and thus, the etching quality of the etchant composition may be deteriorated.

In the etchant composition of an exemplary embodiment, the carbonyl ring compound and the three-nitrogen ring compound may be included in a weight ratio of about 1:0.2 to about 1:2. In the etchant composition of an exemplary embodiment, the carbonyl ring compound and the three-nitrogen ring compound may be included in a weight ratio of about 1:0.2 to about 1:2, and oxygen radicals produced during an etching process may be effectively removed, and the degradation of etching performance may be prevented.

That is, if the weight ratio of the carbonyl ring compound with respect to the three-nitrogen ring compound is greater than about 1:0.2, the role of an oxygen radical scavenger of the three-nitrogen ring compound may be insufficient, and the carbonyl ring compound may be decomposed. Thus, the etching performance of the etchant composition may be deteriorated. In addition, if the weight ratio of the carbonyl ring compound and the three-nitrogen ring compound is less than about 1:2, an excessive amount of the three-nitrogen ring compound may be adsorbed onto a metal layer and etching performance may be deteriorated.

The etchant composition of an exemplary embodiment may further include a hydrogen sulfate. The hydrogen sulfate may be used as a stabilizer of the etchant composition. In an exemplary embodiment, the hydrogen sulfate may be used as the stabilizer of a persulfate. For example, the hydrogen sulfate may play the role of preventing the decrease of etching performance due to the decomposition of the persulfate as the etching progressed. That is, the hydrogen sulfate decreases the decomposition rate of the persulfate, and may play the role of keeping the etching rate of a metal layer including copper in an etching process using the etchant composition of an embodiment constant.

In the etchant composition of an exemplary embodiment, the hydrogen sulfate may be included in an amount of about 0.1 wt % to about 5 wt % based on the total amount of the etchant composition. For example, the etchant composition of an exemplary embodiment may be included in an amount of about 0.2 wt % to about 3 wt % based on the total amount of the etchant composition.

If the amount of the hydrogen sulfate is greater than about 5 wt %, the control of an etching rate is difficult, the etching rate of a metal layer including copper greatly increases, and corrosion defects may be generated. In addition, if the amount of the hydrogen sulfate is less than about 0.1 wt %, the decomposition suppressing effect of the persulfate may not be shown and the stability of the etchant composition may be deteriorated.

The hydrogen sulfate may be ammonium hydrogen sulfate (NH₄HSO₄), lithium hydrogen sulfate (LiHSO₄), potassium hydrogen sulfate (KHSO₄), or sodium hydrogen sulfate (NaHSO₄). The etchant composition of an exemplary embodiment may include at least one of ammonium hydrogen sulfate (NH₄HSO₄), lithium hydrogen sulfate (LiHSO₄), potassium hydrogen sulfate (KHSO₄), or sodium hydrogen sulfate (NaHSO₄). For example, the etchant composition may include any one, or two or more among ammonium hydrogen sulfate (NH₄HSO₄), lithium hydrogen sulfate (LiHSO₄), potassium hydrogen sulfate (KHSO₄), and sodium hydrogen sulfate (NaHSO₄).

The etchant composition of an exemplary embodiment may further include a sulfonic acid compound. The sulfonic acid compound may be used as an auxiliary oxidant. The sulfonic acid compound may play the role of a buffer for supplementing the oxidizing power which is decreased according to the etching process and for keeping an etching rate in the etchant composition. The etchant composition may play the role of increasing etching ratios of a copper layer and a titanium layer.

In the etchant composition of an exemplary embodiment, the sulfonic acid compound may be included in an amount of about 0.1 wt % to about 5 wt % based on the total amount of the etchant composition. For example, the etchant composition may be included in an amount of about 0.5 wt % to about 3 wt % based on the total amount of the etchant composition. Particularly, the etchant composition may be included in an amount of about 1 wt % to about 3 wt % based on the total amount of the etchant composition.

If the amount of the sulfonic acid compound is greater than about 5 wt %, the concentration of copper ions may change according to the progress of an etching process, and thus, an etching rate may gradually increase. In addition, if the amount of the sulfonic acid compound is less than about 0.1 wt %, an etching rate may decrease according to the progress of an etching process, and etching performance may be deteriorated.

The sulfonic acid compound may include sulfamic acid ($H_3NSO_3$), ammonium sulfonic acid, a cyclic sulfonic acid compound, or a hydrocarbon-based sulfonic acid compound. The etchant composition of an embodiment may include at least one of sulfamic acid, ammonium sulfonic acid, a cyclic sulfonic acid compound, or a hydrocarbon-based sulfonic acid compound.

In addition, the cyclic sulfonic acid compound may be a cyclic sulfonic acid compound of 1 to 20 carbon atoms. For example, the carbon number of the cyclic sulfonic acid compound may be 2 to 10, and more particularly, the carbon number of the cyclic sulfonic acid compound may be 3 to 6. The cyclic sulfonic acid compound may include propane sultone, butane sultone, or propene sultone.

The carbon number of the hydrocarbon-based sulfonic acid compound may be 1 to 20. For example, the carbon number of the hydrocarbon-based sulfonic acid compound may be 2 to 10, and more particularly, the carbon number of the hydrocarbon-based sulfonic acid compound may be 3 to 6. The hydrocarbon-based sulfonic acid may include methane sulfonic acid ($CH_3SO_3H$), ethane sulfonic acid ($CH_3CH_2SO_3H$), benzene sulfonic acid ($C_6H_6SO_3H$), or p-toluene sulfonic acid (p-$CH_3C_6HSO_3H$).

The etchant composition of an exemplary embodiment may include any one, or two or more among sulfamic acid, ammonium sulfonic acid, propane sultone, butane sultone, propene sultone, methane sulfonic acid, ethane sulfonic acid, benzene sulfonic acid, and toluene sulfonic acid.

The etchant composition of an exemplary embodiment may further include phosphoric acid ($H_3PO_4$) or a phosphate. The phosphoric acid or the phosphate may be included in the etchant composition and may control the galvanic corrosion of a copper layer or a titanium layer. That is, the phosphoric acid or the phosphate, as a galvanic controller between copper and titanium, may decrease the transporting rate of electrons from a metal layer including titanium to a metal layer including copper, and may decrease skew due to over-etching and decrease a taper angle. The phosphoric acid or the phosphate may play the role of controlling etching performance so that a copper layer and a titanium layer may have a small taper angle. In addition, although the etchant composition is reused, the taper angle may be kept to a constant angle and the life of the etchant composition may be improved.

The etchant composition of an exemplary embodiment may include the phosphoric acid or the phosphate in an amount of about 0.01 wt % to about 5 wt % based on the total amount of the etchant composition. For example, the etchant composition may include the phosphoric acid or the phosphate in an amount of about 0.1 wt % to about 2 wt % based on the total amount of the etchant composition.

If the amount of the phosphoric acid or the phosphate is greater than about 5 wt % or less than about 0.01 wt % based on the total amount of the etchant composition, an initial taper angle of a copper layer and a titanium layer may become too small, and the volume of a wiring may decrease to deteriorate charge mobility.

For example, the phosphate may include at least one of monoammonium phosphate ($NH_4H_2PO_4$), monosodium phosphate ($NaH_2PO_4$), and monopotassium phosphate ($KH_2PO_4$).

The etchant composition of an exemplary embodiment includes water, and water may be included in the etchant composition so that the sum of the compounds constituting the etchant composition and water becomes 100 wt %. That is, though not clearly mentioned in the inventive concept, water may be included such that the total of the sum of wt % of remaining components other than water in the total etchant composition and the wt % of water becomes 100 wt %. Accordingly, water occupies the remaining portion from the sum of wt % of the other components excluding water in the total etchant composition. Water used in the etchant composition may be water having the degree for a semiconductor, or ultrapure water.

The etchant composition of an exemplary embodiment may include about 5 wt % to about 20 wt % of a persulfate, about 0.1 wt % to about 2 wt % of a four-nitrogen ring compound, about 0.01 wt % to about 3 wt % of a carbonyl ring compound having two or more carbonyl groups, about 0.01 wt % to about 2 wt % of a fluorine compound, about 0.01 wt % to about 1 wt % of a three-nitrogen ring compound having a thiol group, about 0.1 wt % to about 5 wt % of a hydrogen sulfate, about 0.1 wt % to about 5 wt % of a sulfonic acid compound, about 0.01 wt % to about 5 wt % of phosphoric acid or a phosphate, and a remaining amount of water.

The etchant composition of an exemplary embodiment is used in a process for manufacturing an electronic apparatus, for example, in a process for forming a metal pattern by etching a stacked metal layer during manufacturing an electronic apparatus. Particularly, the etchant composition may be used in a process for manufacturing an array substrate in a process for manufacturing a display device, and particularly, may be used for forming a gate electrode, etc. by etching a double layer composed of titanium and copper.

The etchant composition of an exemplary embodiment is a non-hydrogen peroxide-based etchant composition which includes a persulfate as a main component, and a metal pattern manufactured by an etching process using the etchant composition of an embodiment shows excellent etching properties including a small critical dimension (CD) skew and a small taper angle. In addition, the etchant composition of an exemplary embodiment may be used for etching a multilayer in which a titanium layer and a copper layer are stacked in a batch, and may minimize the generation of precipitation during an etching process and increase the number of reuse of the etchant composition.

Hereinafter, the method for manufacturing a metal pattern and the method for manufacturing an array substrate according to exemplary embodiments of the inventive concept will be explained.

FIGS. 1A to 1E are cross-sectional views showing a method for manufacturing a metal pattern using an etchant composition of an exemplary embodiment in order. FIGS. 1A to 1E schematically show the cross-sections in a plane which is parallel to a plane defined by a third directional axis DR3, which is a thickness direction, and a first directional axis (DR1), which is orthogonal to the third directional axis DR3.

The method for manufacturing a metal pattern of an exemplary embodiment may include a step of forming a photosensitive layer pattern on a multilayer including titanium and copper, a step of supplying an etchant composition on the multilayer on which the photosensitive layer pattern is formed, and a step of removing the photosensitive layer pattern.

Figure 1A:
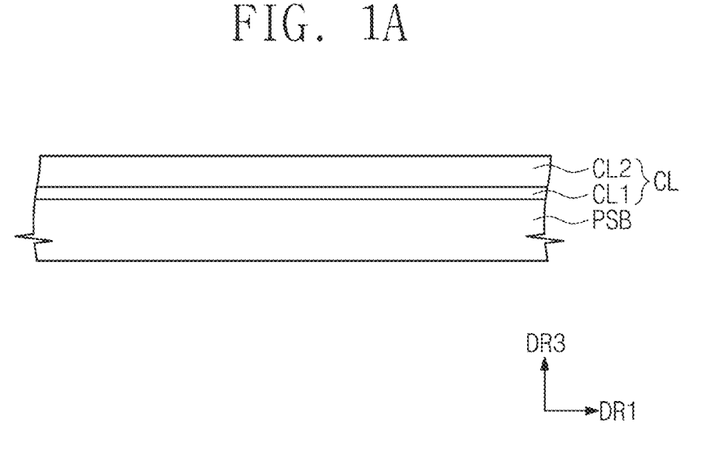
FIGS. 1A, 1B, 1C, 1D, and 1E are cross-sectional views showing steps of a method for manufacturing a metal pattern of an exemplary embodiment using an etchant composition of an exemplary embodiment in order.
Figure 1B:
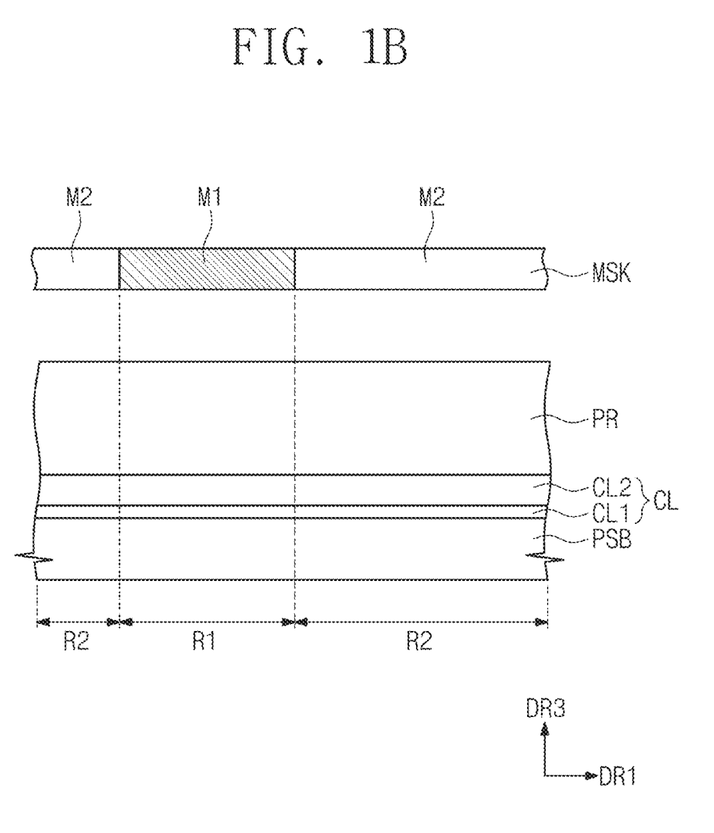
Figure 1C:
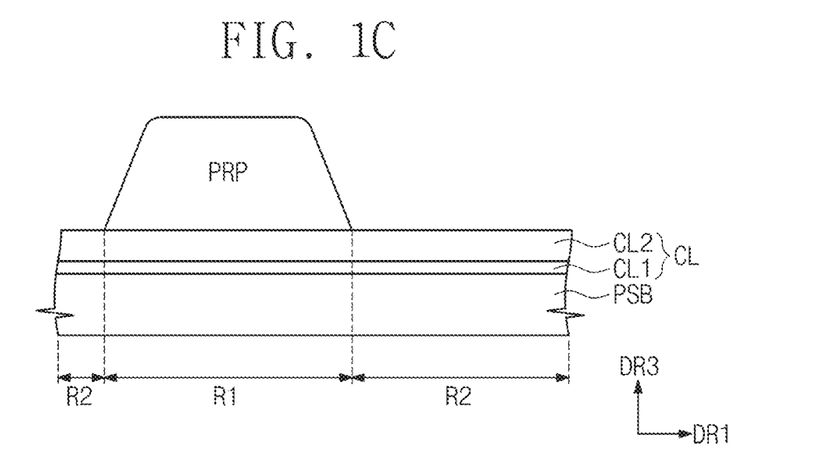

FIGS. 1A to 1C may show a step of forming a photosensitive layer pattern on a multilayer including titanium and copper in the method for manufacturing a metal pattern of an exemplary embodiment. The step for forming a photosensitive layer pattern on a multilayer including titanium and copper may include a step of forming a multilayer including titanium and copper on a substrate, and forming a photosensitive layer pattern on the multilayer.

FIG. 1A may show a step of forming a multilayer CL including titanium and copper on a substrate PSB. FIG. 1A shows a step of providing a first metal layer CL1 and a second metal layer CL2 on the substrate PSB, and the first metal layer CL1 may be a metal layer including titanium and the second metal layer CL2 may be a metal layer including copper. FIG. 1A shows a double layer in which the first metal layer CL1 and the second metal layer CL2 are stacked in order, but the inventive concept is not limited thereto. The multilayer including titanium and copper may be a single layer composed of an alloy including titanium and copper, or a multilayer of three or more, in which a titanium metal layer and a copper metal layer are alternately stacked.

Figure 3:
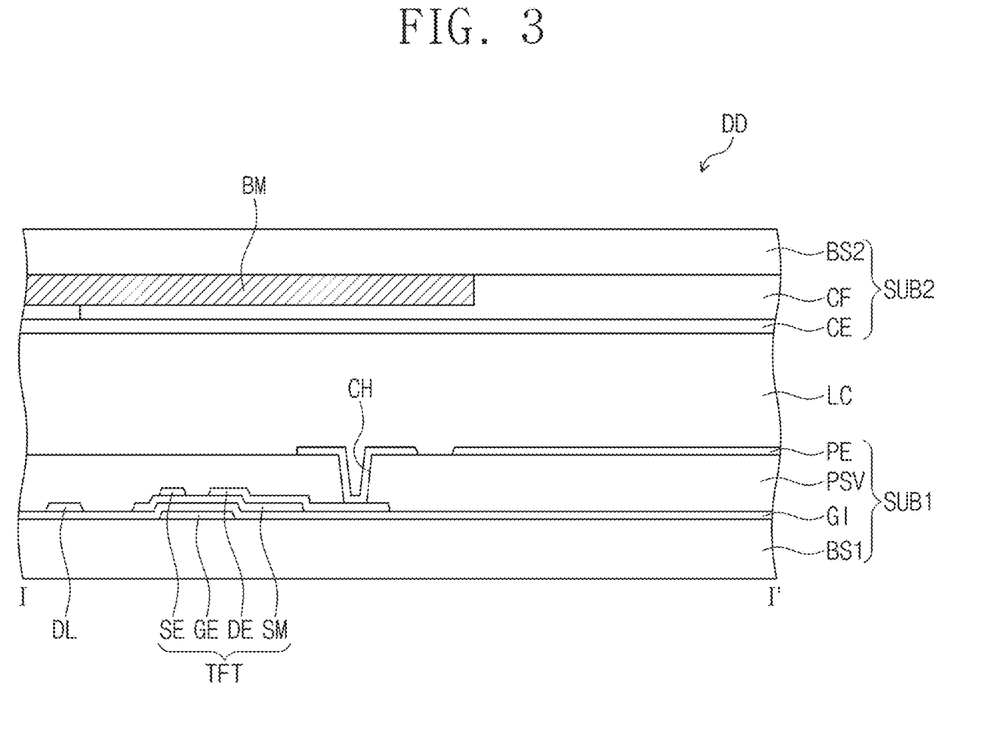
FIG. 3 is a cross-sectional view taken along line I-I' in FIG. 2.

The substrate PSB may be an insulating substrate. Alternatively, the substrate PSB may be an array substrate during a manufacturing process in an exemplary embodiment. For example, the substrate PSB may be an incomplete array substrate, and may be an array substrate in an intermediate step, which is obtained by forming a partial circuit layer on a base substrate. Particularly, the substrate PSB may show a portion of an array substrate SUB1 (FIG. 3) in a display device of an exemplary embodiment, which will be explained later. For example, the substrate PSB may represent a first base substrate BS1 (FIG. 3).

After forming a multilayer CL on the substrate PSB, as shown in FIG. 1A, a photosensitive layer PR is provided on the whole surface of the multilayer CL formed on the substrate PSB, and the photosensitive layer PR is exposed through a mask MSK, as shown in FIG. 1B.

The mask MSK may be composed of a first part M1 which blocks all irradiated light, and a second part M2 which transmits a portion of light and blocks a portion of light. The substrate PSB and the multilayer CL may be divided into a first region R1 and a second region R2, which correspond to the first part M1 and the second part M2, respectively.

Then, after developing the exposed photosensitive layer PR through the mask MSK, as shown in FIG. 1C, a photosensitive layer pattern PRP with a certain thickness may remain on the first region R1, to which light is not supplied due to the blocking by the mask MSK, and the photosensitive layer may be completely removed in the second region R2, to which light passes through the second part M2 of the mask MSK to expose the surface of the substrate PSB. In the explanation referring to FIG. 1B and FIG. 1C, a case of using a positive photosensitive solution for removing an exposed part of the photosensitive layer, is explained as an exemplary embodiment, but the inventive concept is not limited thereto. In an exemplary embodiment, a negative photosensitive solution for removing an unexposed part of the photosensitive layer may be used.

Figure 1D:
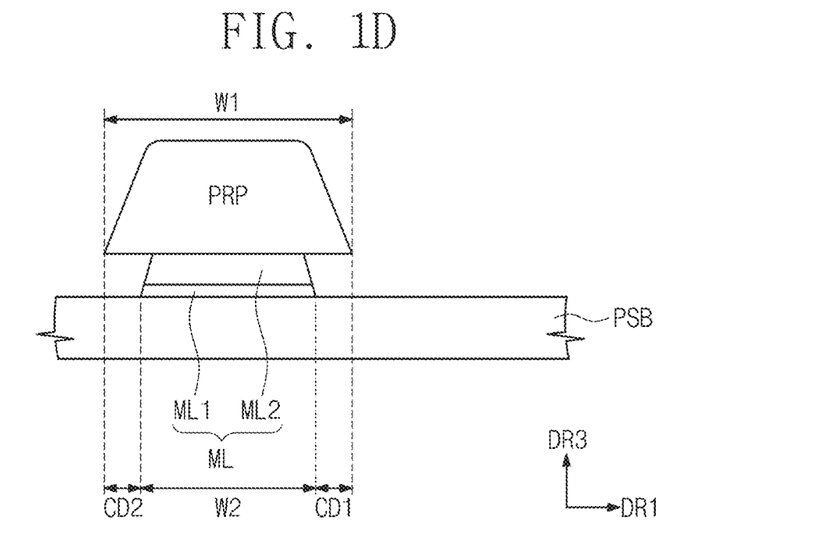

Next, the first metal layer CL1 and the second metal layer CL2 may be patterned using the photosensitive layer pattern PRP. The photosensitive layer pattern PRP may be used as a mask layer for patterning the metal multilayer CL. That is, as shown in FIG. 1C, an etchant composition (not shown) may be supplied on the multilayer CL on which the photosensitive layer pattern PRP is formed, and by the supplied etchant composition, the multilayer CL on which the photosensitive layer pattern PRP is not formed may be etched to form a metal pattern ML as shown in FIG. 1D. The metal pattern ML may include a first metal pattern ML1 and a second metal pattern ML2. The first metal pattern ML1 may be a titanium metal layer, and the second metal pattern ML2 may be a copper metal layer.

The etchant composition supplied in the method for manufacturing a metal pattern of an exemplary embodiment may include a persulfate, a four-nitrogen ring compound, a carbonyl ring compound having two or more carbonyl groups, a fluorine compound, and water. The etchant composition used in the method for manufacturing a metal pattern of an exemplary embodiment may include a persulfate, a four-nitrogen ring compound, a carbonyl ring compound having two or more carbonyl groups, a fluorine compound, a three-nitrogen ring compound having a thiol group, a hydrogen sulfate, a sulfonic acid compound, phosphoric acid or a phosphate, and a remaining amount of water. The etchant composition used in the method for manufacturing a metal pattern of an exemplary embodiment may include about 5 wt % to about 20 wt % of a persulfate, about 0.1 wt % to about 2 wt % of a four-nitrogen ring compound, about 0.01 wt % to about 3 wt % of a carbonyl ring compound having two or more carbonyl groups, about 0.01 wt % to about 2 wt % of a fluorine compound, about 0.01 wt % to about 1 wt % of a three-nitrogen ring compound having a thiol group, about 0.1 wt % to about 5 wt % of a hydrogen sulfate, about 0.1 wt % to about 5 wt % of a sulfonic acid compound, about 0.01 wt % to about 5 wt % of phosphoric acid or a phosphate, and a remaining amount of water.

The etchant composition of an exemplary embodiment may etch the first metal layer CL1 and the second metal layer CL2 in a batch to form the metal pattern ML.

Figure 1E:
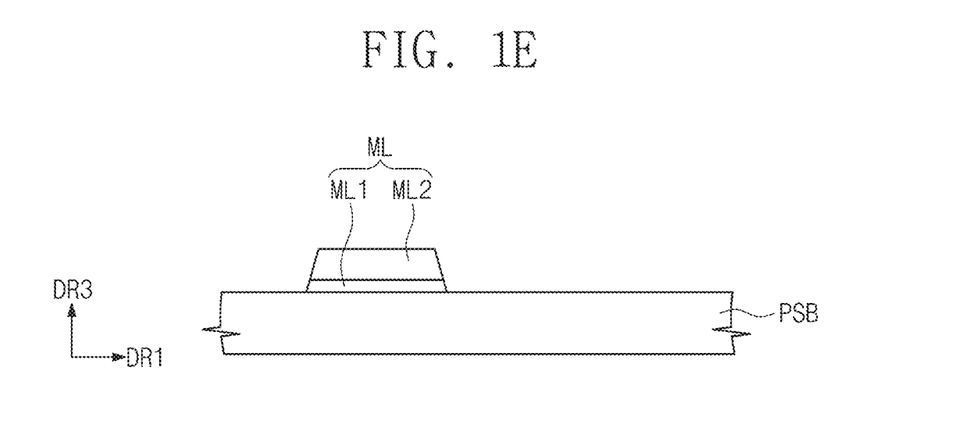

Referring to FIGS. 1D and 1E, the photosensitive layer pattern PRP and the metal pattern ML may have a trapezoidal shape on a cross-section defined by the first directional axis DR1 and the third directional axis DR3. However, the inventive concept is not limited thereto.

The maximum width W2 of the metal pattern ML may be less than the maximum width W1 of the photosensitive layer pattern PRP. In an etching process using the photosensitive layer pattern PRP, the difference (W1-W2) of the maximum width W1 of the photosensitive layer pattern PRP and the maximum width W2 of the metal pattern ML is defined as critical dimension (CD) skew, and in FIG. 1D, "CD1" or "CD2" corresponds to one side CD skew.

After forming the metal pattern ML using the photosensitive layer pattern PRP, the photosensitive layer pattern PRP may be removed. FIG. 1E shows a final metal pattern ML after removing the photosensitive layer pattern PRP. The metal pattern ML may be multilayer metal patterns in which a titanium metal pattern and a copper metal pattern are stacked.

In the method for manufacturing a metal pattern according to an exemplary embodiment of the present invention, a metal pattern composed of a first metal and a second metal, that is, a titanium/copper double layer metal pattern may be manufactured. In the explanation referring to FIG. 1A to FIG. 1E, a method for forming a metal pattern composed of a plurality of layers is explained, but the inventive concept is not limited thereto. A metal pattern formed of a single layer including copper may be also manufactured by substantially the same method.

Figure 2:
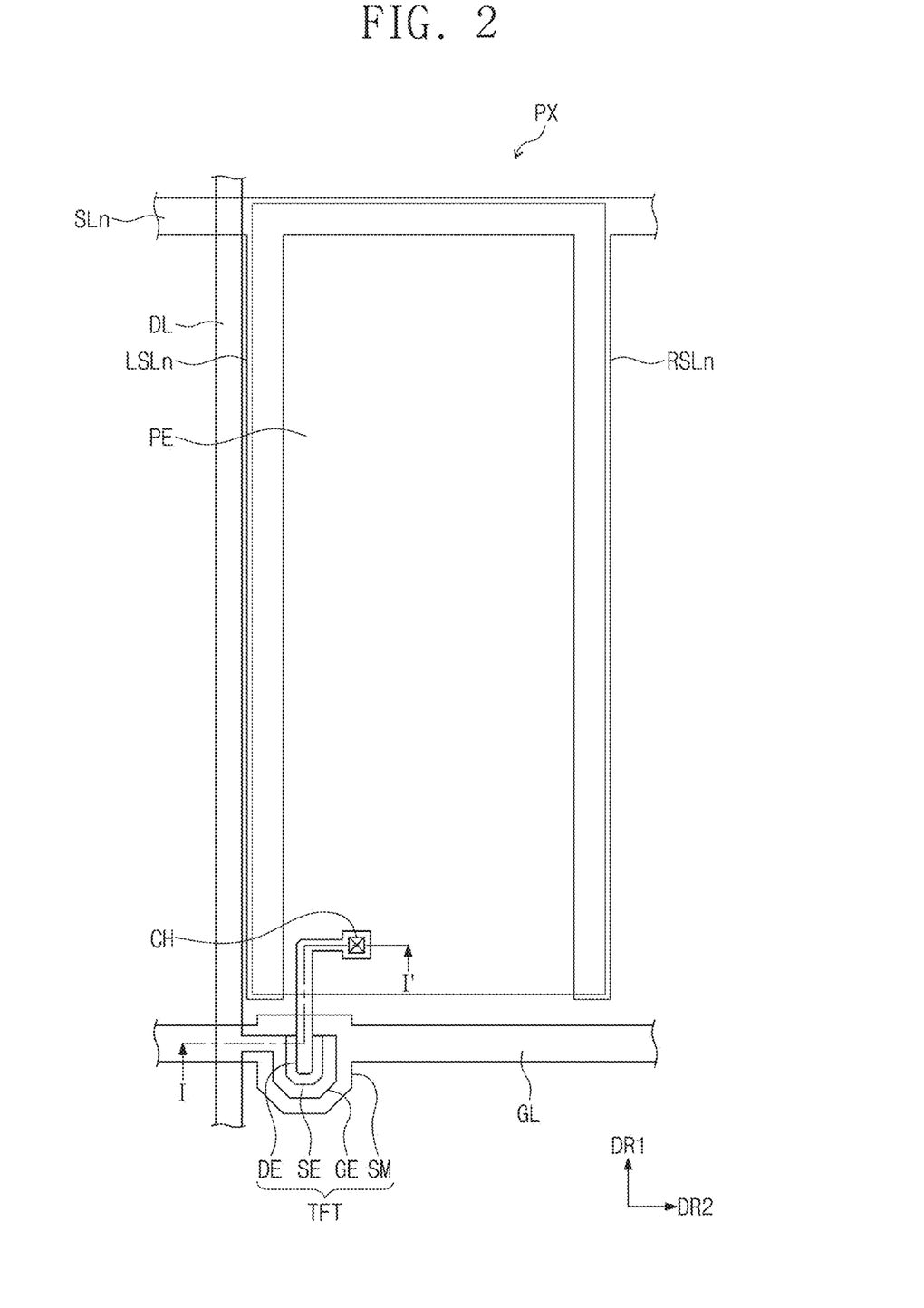
FIG. 2 is a plan view showing one pixel of a display device including an array substrate according to an exemplary embodiment of the inventive concept.

FIG. 2 is a plan view showing one pixel of a display device including an array substrate manufactured by a method for manufacturing an array substrate of an exemplary embodiment. FIG. 3 is a cross-sectional view taken along line I-I' in FIG. 2. Hereinafter, an array substrate manufactured by a method for manufacturing an array substrate of an exemplary embodiment and a display device provided with the same will be explained referring to FIGS. 2 and 3.

The method for manufacturing an array substrate of an exemplary embodiment may include a step of forming a gate line and a gate electrode connected with the gate line on a base substrate, a step of forming a data line which crosses the gate line in an insulation state, a source electrode connected with the data line, and a drain electrode separated from the source electrode, and a step of forming a pixel electrode connected with the drain electrode. In this case, the step of forming the gate line and the gate electrode connected with the gate line may include a step of forming a photosensitive layer pattern on a multilayer including titanium and copper, a step of supplying an etchant composition on the multilayer on which the photosensitive layer pattern is formed, and a step of removing the photosensitive layer pattern.

The etchant composition in the method for manufacturing an array substrate of an exemplary embodiment may include a persulfate, a four-nitrogen ring compound, a carbonyl ring compound having two or more carbonyl groups, a fluorine compound, a three-nitrogen ring compound having a thiol group, a hydrogen sulfate, a sulfonic acid compound, phosphoric acid or a phosphate, and a remaining amount of water. The etchant composition used in the method for manufacturing an array substrate of an exemplary embodiment may include about 5 wt % to about 20 wt % of a persulfate, about 0.1 wt % to about 2 wt % of a four-nitrogen ring compound, about 0.01 wt % to about 3 wt % of a carbonyl ring compound having two or more carbonyl groups, about 0.01 wt % to about 2 wt % of a fluorine compound, about 0.01 wt % to about 1 wt % of a three-nitrogen ring compound having a thiol group, about 0.1 wt % to about 5 wt % of a hydrogen sulfate, about 0.1 wt % to about 5 wt % of a sulfonic acid compound, about 0.01 wt % to about 5 wt % of phosphoric acid or a phosphate, and a remaining amount of water.

The array substrate manufactured by the method for manufacturing an array substrate of an exemplary embodiment may be applied as a substrate including an electronic circuit for driving a display device. The kind of the display device is not specifically limited, but may include, for example, a liquid crystal display device, an organic light emitting display device, an electrophoretic display device, an electrowetting display device, a microelectromechanical system (MEMS) display device, etc.

A liquid crystal display device is shown as a display device in FIGS. 2 and 3, but the inventive concept is not limited thereto. For example, the display device may be an organic light emitting display device. In an exemplary embodiment of a display device having a plurality of pixels, each pixel is formed by the same structure, and for the convenience of explanation, one pixel is shown in FIGS. 2 and 3. For the convenience of explanation, a pixel PX, which is connected to one gate line among gate lines GL and one data line among data lines DL, is shown in FIG. 2, but the inventive concept is not limited thereto. For example, one gate line and one data line may be connected with a plurality of pixels, and a plurality of gate lines and a plurality of data lines may be connected with one pixel.

Referring to FIGS. 2 and 3, a display device DD may include an array substrate SUB1 provided with a pixel PX, an opposed substrate SUB2 which faces the array substrate SUB1, and a liquid crystal layer LC disposed between the array substrate SUB1 and the opposed substrate SUB2.

In order to explain referring to FIGS. 2 and 3, the gate line GL is extended in a second directional axis DR2 and provided. The gate line GL may be formed on the first base substrate BS1. The data line DL may be extended in a first directional axis DR1 which is orthogonal to the gate line GL and provided.

Each of the pixels PX includes a thin film transistor TFT, a pixel electrode PE connected with the thin film transistor TFT, and a storage electrode part. The thin film transistor TFT includes a gate electrode GE, a gate insulating layer GI, a semiconductor pattern SM, a source electrode SE, and a drain electrode DE. The storage electrode part may further include a storage line SLn extended in a second directional axis DR2, and a first branched electrode LSLn and a second branched electrode RSLn, which are branched from the storage line SLn and extended in a first directional axis DR1.

The gate electrode GE may be protruded from the gate line GL or provided on a partial region of the gate line GL. The gate electrode GE may be formed using a metal. The gate electrode GE may be formed using nickel, chromium, molybdenum, aluminum, titanium, copper, tungsten, or an alloy including the same. The gate electrode GE may be formed as a single layer or a multilayer using a metal.

The semiconductor pattern SM is provided on the gate insulating layer GI.

The semiconductor pattern SM is provided on the gate electrode GE with the gate insulating layer GI disposed therebetween. The semiconductor pattern SM is partially overlapped with the gate electrode GE. The semiconductor pattern SM includes an active pattern (not shown) provided on the gate insulating layer GI and an ohmic contact layer (not shown) formed on the active pattern. The active pattern may be formed using an amorphous silicon thin film, and the ohmic contact layer (not shown) may be formed using an n+ amorphous silicon thin film. The ohmic contact layer (not shown) makes an ohmic contact between the active pattern, and the source electrode SE and the drain electrode DE, respectively.

The source electrode SE is branched from the data lines DL and provided. The source electrode SE is formed on the ohmic contact layer (not shown) and is partially overlapped with the gate electrode GE. The data line DL may be disposed on the gate insulating layer GI, where the semiconductor pattern SM is not disposed.

The drain electrode DE is separated from the source electrode SE with the semiconductor pattern SM disposed therebetween. The drain electrode DE is formed on the ohmic contact layer (not shown) and is partially overlapped with the gate electrode GE.

In an exemplary embodiment, the gate line GL and the gate electrode GE may be formed as a multilayer including a metal layer including copper and a metal layer including titanium. That is, the gate line GL and the gate electrode GE may be a double layer metal pattern of a titanium metal pattern and a copper metal pattern, which are formed by etching a titanium metal layer and a copper metal layer, which are stacked in order. However, the inventive concept is not limited thereto. For example, the gate line GL and the gate electrode GE may be a metal pattern of a single layer formed using an alloy of titanium and copper, or a multilayer metal pattern which is obtained by stacking three or more layers of a titanium metal pattern and a copper metal pattern.

In an exemplary embodiment, the gate line GL and the gate electrode GE may be formed by patterning by an etching process using the etchant composition of an embodiment. In the method for manufacturing an array substrate of an exemplary embodiment, using the etchant composition of an exemplary embodiment, the metal pattern may be formed to have a small CD skew value and a small taper angle during patterning a double layer of a titanium metal layer and a copper metal layer, so that the gate line GL and the gate electrode GE may have excellent taper profiles.

In addition, in the method for manufacturing an array substrate of an exemplary embodiment, the etchant composition of an exemplary embodiment may serve the gate electrode GE having a small taper angle, and the gate insulating layer GI, the semiconductor pattern SM, the source electrode SE and the drain electrode DE, which are subsequently formed by stacking, may have excellent step coverage.

The taper angle of the gate electrode GE, which is formed by etching using the etchant composition of an exemplary embodiment, may be from about 30 degrees to about 60 degrees. For example, the taper angle of the gate electrode GE may be from about 40 degrees to about 45 degrees.

In an exemplary embodiment, the insulating layer PSV of the array substrate SUB1 may cover the source electrode SE, the drain electrode DE, the channel part, and the gate insulating layer GI, and may have a contact hole CH which partially exposes the drain electrode DE. The insulating layer PSV may include, for example, silicon nitride or silicon oxide.

The pixel electrode PE is connected with the drain electrode DE via the contact hole CH formed in the insulating layer PSV. The pixel electrode PE is formed using a transparent conductive material. Particularly, the pixel electrode PE is formed using a transparent conductive oxide. The transparent conductive oxide may be indium tin oxide (ITO), indium zinc oxide (IZO), indium tin zinc oxide (ITZO), etc.

That is, the array substrate SUB1 may include the thin film transistor TFT, the insulating layer PSV, and the pixel electrode PE formed on the first base substrate BS1. Although not shown in the drawings, the array substrate SUB1 may further include an alignment layer (not shown) formed on the pixel electrode PE.

The opposed substrate SUB2 may be disposed to face the array substrate SUB1, and may include a second base substrate BS2, a color filter CF disposed under the second base substrate BS2, a light blocking part BM disposed between the color filters CF which realize different colors, for blocking light, and a common electrode CE, which forms an electric field with the pixel electrode PE. Although not shown in the drawings, an alignment layer (not shown) may be further disposed under the common electrode CE.

In the method for manufacturing an array substrate of an exemplary embodiment, a gate line and a gate electrode may be formed so as to have a small taper angle, and to form an excellent metal pattern by using the etchant composition of an exemplary embodiment, including a persulfate, a four-nitrogen ring compound, a carbonyl ring compound having two or more carbonyl groups, a fluorine compound, a three-nitrogen ring compound having a thiol group, a hydrogen sulfate, a sulfonic acid compound, phosphoric acid or a phosphate, and a remaining amount of water.

Hereinafter, the etching properties of the etchant composition of an exemplary embodiment and a metal pattern manufactured using the same will be particularly explained referring to examples and comparative examples. However, the etchant compositions and metal patterns formed using the same in the examples are only illustrations, and the examples do not limit the scope of exemplary embodiments.

The etchant compositions according to Examples 1 to 17 and the etchant compositions according to Comparative Examples 1 to 9 were prepared using the configurations suggested in Table 1 below. The unit representing the amount of each component in Table 1 represents wt % with respect to 100 wt % of the total amount of the etchant composition. In Table 1, the remaining amount with respect to 100 wt % of the total amount of the etchant composition corresponds to water.

TABLE 1

| | Persulfate | Four-nitrogen ring compound | Carbonyl ring compound | Fluorine compound | Three-nitrogen ring compound | Hydrogen sulfate | Sulfonic acid compound | Phosphoric acid or phosphate | Carbonyl ring compound |
|---|---|---|---|---|---|---|---|---|---|
| Example 1 | 14 | 0.4 | 0.2 | 0.5 | 0.2 | 0.2 | 1.5 | 1 | 0 |
| Example 2 | 14 | 0.4 | 0.2 | 0.5 | 0.2 | 0.2 | 1.5 | 1 | 0 |
| Example 3 | 14 | 0.4 | 0.05 | 0.5 | 0.2 | 0.2 | 1.5 | 1 | 0 |
| Example 4 | 14 | 0.4 | 0.2 | 0.5 | 0.05 | 0.2 | 1.5 | 1 | 0 |
| Example 5 | 14 | 0.4 | 0.2 | 0.5 | 0.2 | 3 | 1.5 | 1 | 0 |
| Example 6 | 14 | 0.4 | 0.2 | 0.5 | 0.2 | 0.2 | 1.5 | 0 | 0 |
| Example 7 | 14 | 0.4 | 0.2 | 0.5 | 0.2 | 0.2 | 1.5 | 6 | 0 |
| Example 8 | 14 | 0.4 | 0.2 | 0.5 | 0.03 | 0.2 | 1.5 | 1 | 0 |
| Example 9 | 14 | 0.4 | 0.2 | 0.5 | 0.5 | 0.2 | 1.5 | 1 | 0 |
| Example 10 | 14 | 0.4 | 0.2 | 0.5 | 0.2 | 0 | 1.5 | 1 | 0 |
| Example 11 | 14 | 0.4 | 0.2 | 0.5 | 0.2 | 5.5 | 1.5 | 1 | 0 |
| Example 12 | 14 | 0.4 | 0.2 | 0.5 | 0 | 0.2 | 1.5 | 1 | 0 |
| Example 13 | 14 | 0.4 | 0.2 | 0 | 0.2 | 0.2 | 1.5 | 1 | 0 |
| Example 14 | 14 | 0.4 | 0.2 | 2.2 | 0.2 | 0.2 | 1.5 | 1 | 0 |
| Example 15 | 14 | 0.4 | 0.2 | 0.5 | 1.5 | 0.2 | 1.5 | 1 | 0 |
| Example 16 | 14 | 0.4 | 0.2 | 0.5 | 0.2 | 0.2 | 0 | 1 | 0 |
| Example 17 | 14 | 0.4 | 0.2 | 0.5 | 0.2 | 0.2 | 6 | 1 | 0 |
| Comparative Example 1 | 14 | 0.4 | 0.03 | 0.5 | 0.2 | 0.2 | 1.5 | 1 | 0 |
| Comparative Example 2 | 14 | 0.4 | 1 | 0.5 | 0.2 | 0.2 | 1.5 | 1 | 0 |
| Comparative Example 3 | 14 | 0.4 | 0 | 0.5 | 0.2 | 0.2 | 1.5 | 1 | 0 |
| Comparative Example 4 | 14 | 0.4 | 0 | 0.5 | 0.2 | 0.2 | 1.5 | 1 | 0.2 |
| Comparative Example 5 | 14 | 0 | 0.2 | 0.5 | 0.2 | 0.2 | 1.5 | 1 | 0 |

TABLE 1-continued

| | Persulfate | Four-nitrogen ring compound | Carbonyl ring compound | Fluorine compound | Three-nitrogen ring compound | Hydrogen sulfate | Sulfonic acid compound | Phosphoric acid or phosphate | Carbonyl ring compound |
|---|---|---|---|---|---|---|---|---|---|
| Comparative Example 6 | 4 | 0.4 | 0.2 | 0.5 | 0.2 | 0.2 | 1.5 | 1 | 0 |
| Comparative Example 7 | 22 | 0.4 | 0.2 | 0.5 | 0.2 | 0.2 | 1.5 | 1 | 0 |
| Comparative Example 8 | 14 | 2.2 | 0.2 | 0.5 | 0.2 | 0.2 | 1.5 | 1 | 0 |
| Comparative Example 9 | 14 | 0.4 | 3.5 | 0.5 | 0.2 | 0.2 | 1.5 | 1 | 0 |

In the Examples and the Comparative Examples suggested in Table 1, ammonium persulfate was used as the persulfate, aminotetrazole was used as the four-nitrogen ring compound, hydantoin was used as the carbonyl ring compound, ammonium bifluoride was used as the fluorine compound, 3-amino-1,2,4-triazole-5-thiol was used as the three-nitrogen ring compound, sodium hydrogen sulfate was used as the hydrogen sulfate, sulfamic acid was used as the sulfonic acid compound, and phosphoric acid was selected and used as the phosphoric acid or the phosphate.

The etchant compositions suggested in Examples 1 to 17 included about 5 wt % to about 20 wt % of a persulfate, about 0.1 wt % to about 2 wt % of a four-nitrogen ring compound, and about 0.01 wt % to about 3 wt % of a carbonyl ring compound having two or more carbonyl groups, and corresponded to cases where the weight ratio of the four-nitrogen ring compound and the carbonyl ring compound having two or more carbonyl groups was from about 1:0.1 to about 1:2.

Particularly, the etchant compositions of Examples 1 to 5, suggested in Table 1, correspond to cases including about 5 wt % to about 20 wt % of a persulfate, about 0.1 wt % to about 2 wt % of a four-nitrogen ring compound, about 0.01 wt % to about 3 wt % of a carbonyl ring compound having two or more carbonyl groups, about 0.01 wt % to about 2 wt % of a fluorine compound, about 0.01 wt % to about 1 wt % of a three-nitrogen ring compound having a thiol group, about 0.1 wt % to about 5 wt % of a hydrogen sulfate, about 0.1 wt % to about 5 wt % of a sulfonic acid compound, and about 0.01 wt % to about 5 wt % of phosphoric acid or a phosphate. In addition, in the etchant compositions of Examples 1 to 5 as suggested in Table 1, the weight ratio of the four-nitrogen ring compound and the carbonyl ring compound satisfy a range of about 1:0.1 to about 1:2, and the weight ratio of the carbonyl ring compound having two or more carbonyl groups and the three-nitrogen ring compound satisfy a range of about 1:0.2 to about 1:2.

When compared with Examples 1 to 5, Example 6 corresponds to a case excluding phosphoric acid or a phosphate, and Example 7 corresponds to a case including phosphoric acid or a phosphate. Example 8 corresponds to a case where the weight ratio of the carbonyl ring compound and the three-nitrogen ring compound is less than about 1:0.2, and Example 9 corresponds to a case where the weight ratio of the carbonyl ring compound and the three-nitrogen ring compound is greater than about 1:2. Example 10 corresponds to a case excluding a hydrogen sulfate, and Example 11 corresponds to an etchant composition including an excessive amount of a hydrogen sulfate. Example 12 corresponds to a case excluding the three-nitrogen ring compound, and Example 13 corresponds to a case excluding a fluorine compound. Example 14 corresponds to a case including an excessive amount of a fluorine compound, Example 15 corresponds to a case including an excessive amount of three-nitrogen ring compound, Example 16 corresponds to a case excluding a sulfonic acid compound, and Example 17 corresponds to an etchant composition including an excessive amount of a sulfonic acid compound.

Comparative Example 1 corresponds to a case where the weight ratio of the four-nitrogen ring compound and the carbonyl ring compound having two or more carbonyl groups was greater than about 1:0.1, and Comparative Example 2 corresponds to an etchant composition where the weight ratio of four-nitrogen ring compound and the carbonyl ring compound having two or more carbonyl groups was less than about 1:2. Comparative Example 3 corresponds to an etchant composition excluding the carbonyl ring compound having two or more carbonyl groups, Comparative Example 4 corresponds to a case where the carbonyl ring compound having two or more carbonyl groups is not included, and the carbonyl ring compound having one carbonyl group is included, Comparative Example 5 corresponds to a case excluding the four-nitrogen ring compound, and Comparative Example 6 corresponds to a case including a small amount of the persulfate. Comparative Example 7 corresponds to a case including an excessive amount of the persulfate, Comparative Example 8 corresponds to a case including an excessive amount of the four-nitrogen ring compound, and Comparative Example 9 corresponds to a case including an excessive amount of the carbonyl ring compound having two or more carbonyl groups.

(Manufacture and Evaluation of Metal Pattern)

An etching test with respect to a double layer of a titanium metal layer and a copper metal layer was carried out using the etchant compositions suggested in Table 1. Through the etching test, with respect to a double layer of a titanium metal layer of about 200 Å and a copper metal layer of about 6,000 Å, each etchant composition of the Examples and the Comparative examples was supplied at temperature conditions of about 28° C., and an etching amount accumulation degree, an initial taper angle, and keeping degree of a taper angle were evaluated on the basis of 100% over-etching point, which was twice as much of the end point detection time (EPD) when an upper copper layer was completely etched. The etching amount accumulation degree was decided whether etching quality was kept or not according to the increase of the copper content in the etchant composition according to the reuse of the etchant.

In Table 2 below, the etching quality evaluation results of the Examples and the Comparative Examples are shown. In Table 2, an etching amount accumulation degree, an initial taper angle, and the keeping of a taper angle for a case of manufacturing a metal pattern using each etchant composition of the Examples and the Comparative Examples, are shown. The evaluation standards of the etching amount accumulation degree, the initial taper angle, and the keeping of a taper angle were based on the contents below. In addition, with respect to each item of the etching amount accumulation degree, the initial taper angle, and the keeping of a taper angle, the scores for excellent, common and bad were summarized, and the summarized evaluation results are shown in Table 2.

<Evaluation Standard of Etching Amount Accumulation Degree>
O (excellent, 2 points): a case where etching quality was excellent until Cu ions were included by about 6,000 ppm or more
Δ (common, 1 point): a case where etching quality was excellent until Cu ions were included by from about 4,000 ppm to less than about 6,000 ppm
X (bad, 0 points): a case where etching quality was excellent until Cu ions were included by less than about 4,000

Figure 4:
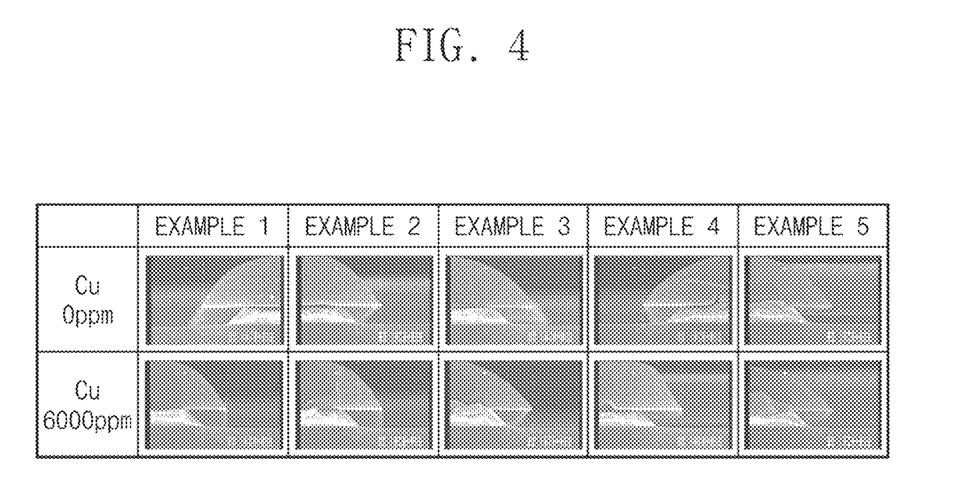
FIG. 4 illustrates electron scanning microscopic images on metal patterns of an exemplary embodiment.

<Evaluation Standard of Initial Taper Angle>
O (excellent, 2 points): from about 40 degrees to less than about 50 degrees
Δ (common, 1 point): from about 30 degrees to less than about 40 degrees, from about 50 degrees to less than about 60 degrees
X (bad, 0 points): less than about 30 degrees, greater than about 60 degrees <Evaluation Standard of Keeping Taper Angle>
O (excellent, 2 points): a case where the change of a taper angle was less than about 5° until Cu ions became about 6,000 ppm X (bad, 0 points): a case where the change of a taper angle was about 5° or more until Cu ions became about 6,000 ppm In addition, FIG. 4 illustrates electron scanning microscopic images of cross-sections after performing an etching process for Example 1 to Example 5, and in FIG. 4, "Cu 0 ppm" and "Cu 6000 ppm" correspond to a case where an etchant composition was initially used and a case where the etchant composition was reused until the concentration of Cu ions became about 6,000 ppm, respectively.

TABLE 2

|  | Etching amount accumulation degree | Initial taper angle | Keeping of taper angle | Comprehensive evaluation results |
| --- | --- | --- | --- | --- |
| Example 1 | o | o | o | 6 |
| Example 2 | o | o | o | 6 |
| Example 3 | o | o | o | 6 |
| Example 4 | o | o | o | 6 |
| Example 5 | o | o | o | 6 |
| Example 6 | o | x | Δ | 3 |
| Example 7 | o | x | o | 4 |
| Example 8 | Δ | o | x | 3 |
| Example 9 | Δ | o | x | 3 |
| Example 10 | Δ | o | x | 3 |
| Example 11 | o | Δ | o | 5 |
| Example 12 | Δ | O | x | 3 |
| Example 13 | O | x | Δ | 3 |
| Example 14 | O | x | Δ | 3 |
| Example 15 | O | x | Δ | 3 |
| Example 16 | Δ | Δ | Δ | 3 |
| Example 17 | O | x | Δ | 3 |
| Comparative Example 1 | Δ | Δ | x | 2 |
| Comparative Example 2 | x | o | x | 2 |
| Comparative Example 3 | x | Δ | x | 1 |
| Comparative Example 4 | Δ | Δ | x | 2 |

TABLE 2-continued

|  | Etching amount accumulation degree | Initial taper angle | Keeping of taper angle | Comprehensive evaluation results |
| --- | --- | --- | --- | --- |
| Comparative Example 5 | — | x | — | 0 |
| Comparative Example 6 | x | x | — | 0 |
| Comparative Example 7 | O | x | x | 2 |
| Comparative Example 8 | x | x | x | 0 |
| Comparative Example 9 | x | x | x | 0 |

Referring to the results of Table 2, Example 1 to Example 17 were found to show excellent etching properties when compared with Comparative Example 1 to Comparative Example 9. That is, the etchant compositions of Example 1 to Example 17, which included about 5 wt % to about 20 wt % of a persulfate, about 0.1 wt % to about 2 wt % of a four-nitrogen ring compound, and about 0.01 wt % to about 3 wt % of a carbonyl ring compound having two or more carbonyl groups, and had the weight ratio of the four-nitrogen ring compound and the carbonyl ring compound having two or more carbonyl groups of about 1:0.1 to about 1:2 were found to show excellent etching amount accumulation degrees, initial taper angles and taper angle keeping properties. In contrast, Comparative Example 1 to Comparative Example 9, which do not satisfy the configuration of an etchant composition which included about 5 wt % to about 20 wt % of a persulfate, about 0.1 wt % to about 2 wt % of a four-nitrogen ring compound, and about 0.01 wt % to about 3 wt % of a carbonyl ring compound having two or more carbonyl groups, and had the weight ratio of the four-nitrogen ring compound and the carbonyl ring compound having two or more carbonyl groups of about 1:0.1 to about 1:2, showed deteriorated etching quality when compared with the Examples.

Particularly, the etchant compositions of Examples 1 to 5 include a persulfate, a four-nitrogen ring compound, a carbonyl ring compound having two or more carbonyl groups, a fluorine compound, a three-nitrogen ring compound, a hydrogen sulfate, a sulfonic acid compound, phosphoric acid or a phosphate, and water, and included each component in an appropriate ratio, thereby showing excellent etching properties.

Example 1 to Example 17 show excellent etching amount accumulation degrees when compared with Comparative Example 2, Comparative Example 3, Comparative Example 6, Comparative Example 8, and Comparative Example 9. That means that the etchant composition of an exemplary embodiment has excellent etching treatment capacity, although used repeatedly. In addition, Example 1 to Example 5, Example 8 to Example 12, and Example 16 serve a metal pattern with an appropriate initial taper angle to show excellent etching quality when compared with Comparative Example 5 to Comparative Example 9. Example 1 to Example 7, Example 11, and Example 13 to Example 17 show excellent taper angle keeping degree of a metal pattern when compared with Comparative Example 1 to Comparative Example 4, and Comparative Example 7 to Comparative Example 9.

That is, when compared with Comparative Example 1 to Comparative Example 9, Example 1 to Example 17 use the etchant composition of an exemplary embodiment and may form a metal pattern having an excellent taper angle. In addition, the etchant composition of an exemplary embodiment was found to keep excellent etching quality though used repeatedly.

Figure 5A:
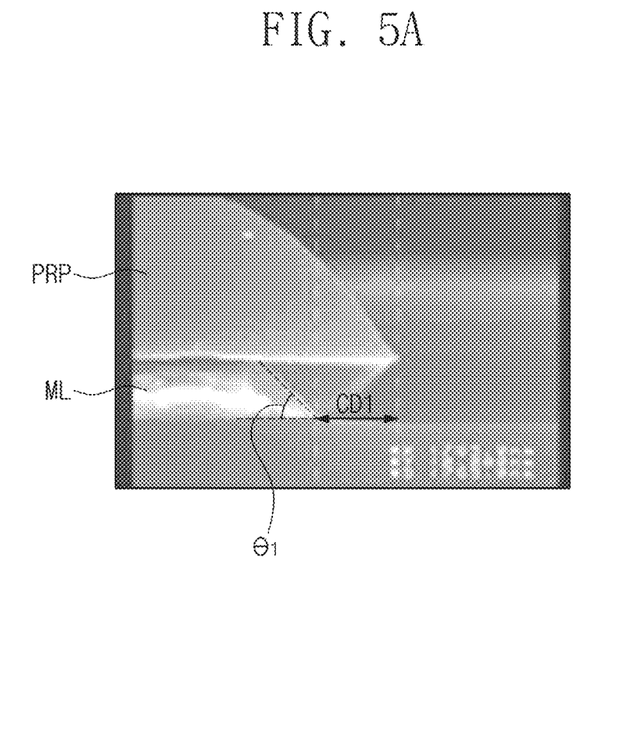
FIGS. 5A and 5B illustrate electron scanning microscopic images on metal patterns of an exemplary embodiment and a comparative embodiment, respectively.
Figure 5B:
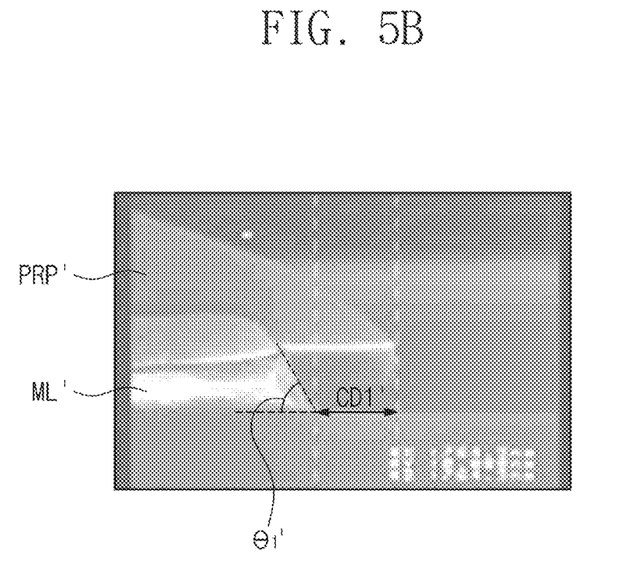

FIGS. 5A and 5B illustrate electron scanning microscopic images after an etching process in Example 2 and Comparative Example 1, respectively. FIGS. 5A and 5B illustrate images on cross-sections of metal patterns ML and ML' formed under photosensitive layer patterns PRP and PRP'. When comparing FIG. 5A with FIG. 5B, it was found that the one side CD skew CD1 of the metal pattern ML of the Example was smaller than the one side CD skew CD1' of the metal pattern ML' of the Comparative Example, and the taper angle ($\theta_1$) of the metal pattern ML of the Example was smaller than the taper angle ($\theta_1'$) of the metal pattern ML' of the Comparative Example. From the results, it was found that an excellent metal pattern having a smaller CD skew value and a smaller taper angle was formed in the Example when compared with the Comparative Example.

The etchant composition of an exemplary embodiment may be used for etching multiple metal layers of a titanium metal layer and a copper metal layer in a batch, and may maintain stable etching properties, although repeatedly used. In addition, the etchant composition of an exemplary embodiment may maintain a taper angle, which is the etching properties of a metal pattern, to a constant degree or less, may show high etching amount accumulation degree, may keep a taper angle excellent, and may show excellent etching properties. In addition, a metal pattern and an array substrate manufactured by using the etchant composition of an exemplary embodiment were found to have excellent taper profiles.

An exemplary embodiment provides an etchant composition having excellent storage stability and improves the etching properties of a multilayer including copper.

An exemplary embodiment provides a method for manufacturing a metal pattern, which improves productivity and wiring defects, such as short-circuit.

An exemplary embodiment provides a method for manufacturing an array substrate in which a multilayer, etc. have an appropriate taper angle, and the step coverage of a metal layer, which is stacked on the multilayer, is excellent.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An etchant composition, comprising:
   from 5 wt % to 20 wt % of a persulfate;
   from 0.1 wt % to 2 wt % of a four-nitrogen ring compound;
   from 0.01 wt % to 3 wt % of a carbonyl ring compound having two or more carbonyl groups; and
   water,
   wherein a weight ratio of the four-nitrogen ring compound and the carbonyl ring compound is in a range from 1:0.1 to 1:2.

2. The etchant composition of claim 1, further comprising from 0.01 wt % to less than 1 wt % of a three-nitrogen ring compound having a thiol group.

3. The etchant composition of claim 2, wherein a weight ratio of the carbonyl ring compound and the three-nitrogen ring compound is in a range from 1:0.2 to 1:2.

4. The etchant composition of claim 1, further comprising from 0.1 wt % to 5 wt % of a hydrogen sulfate.

5. The etchant composition of claim 1, further comprising from 0.01 wt % to 2 wt % of a fluorine compound.

6. The etchant composition of claim 1, further comprising from 0.1 wt % to 5 wt % of a sulfonic acid compound.

7. The etchant composition of claim 1, further comprising from 0.01 wt % to 5 wt % of phosphoric acid or a phosphate.

8. The etchant composition of claim 1, further comprising:
   from 0.01 wt % to 2 wt % of a fluorine compound;
   from 0.01 wt % to 1 wt % of a three-nitrogen ring compound having a thiol group;
   from 0.1 wt % to 5 wt % of a hydrogen sulfate;
   from 0.1 wt % to 5 wt % of a sulfonic acid compound; and
   from 0.01 wt % to 5 wt % of phosphoric acid or a phosphate.

9. The etchant composition of claim 1, wherein the persulfate comprises at least one of potassium persulfate ($K_2S_2O_8$), sodium persulfate ($Na_2S_2O_8$), or ammonium persulfate ($(NH_4)_2S_2O_8$).

10. The etchant composition of claim 1, wherein the four-nitrogen ring compound comprises at least one of aminotetrazole, methyltetrazole, or mercaptomethyltetrazole.

11. The etchant composition of claim 1, wherein the carbonyl ring compound comprises at least one of thiazolidinedione, hydantoin, or succinimide.

12. The etchant composition of claim 5, wherein the fluorine compound comprises at least one of hydrogen fluoride (HF), ammonium fluoride ($NH_4F$), potassium fluoride (KF), sodium fluoride (NaF), ammonium bifluoride ($F_2H_5N$), potassium bifluoride ($KHF_2$), or sodium bifluoride ($NaHF_2$).

13. The etchant composition of claim 2, wherein the three-nitrogen ring compound having a thiol group comprises at least one of 3-mercapto-4-methyl-4H-1,2,4- triazole, 3-amino-1,2,4-triazole-5-thiol, or 1H-1,2,4-triazole-3-thiol.

14. The etchant composition of claim 4, wherein the hydrogen sulfate comprises at least one of ammonium hydrogen sulfate ($NH_4HSO_4$), lithium hydrogen sulfate ($LiHSO_4$), potassium hydrogen sulfate ($KHSO_4$), or sodium hydrogen sulfate ($NaHSO_4$).

15. The etchant composition of claim 6, wherein the sulfonic acid compound comprises at least one of methane sulfonic acid, benzene sulfonic acid, p-toluene sulfonic acid, ammonium sulfonic acid, amido sulfonic acid, a cyclic sulfonic acid compound, or a hydrocarbon-based sulfonic acid compound.

16. A method for manufacturing a metal pattern, the method comprising:
   forming a photosensitive layer pattern on a multilayer comprising titanium and copper;
   providing an etchant composition on the multilayer on which the photosensitive layer pattern is formed; and
   removing the photosensitive layer pattern,
   wherein:
   the etchant composition comprises a persulfate, a four-nitrogen ring compound, a carbonyl ring compound having two or more carbonyl groups, and water; and
   a weight ratio of the four-nitrogen ring compound and the carbonyl ring compound is in a range from 1:0.1 to 1:2;
   the etchant composition further comprises a three-nitrogen ring compound having a thiol group, a hydrogen sulfate, a fluorine compound, a sulfonic acid compound, and phosphoric acid or a phosphate; and the etchant composition comprises, based on a total amount of the etchant composition:
    from 5 wt % to 20 wt % of the persulfate;
    from 0.1 wt % to 2 wt % of the four-nitrogen ring compound;
    from 0.01 wt % to 3 wt % of the carbonyl ring compound;
    from 0.01 wt % to 2 wt % of the fluorine compound;
    from 0.01 wt % to 1 wt % of the three-nitrogen ring compound;
    from 0.1 wt % to 5 wt % of the hydrogen sulfate;
    from 0.1 wt % to 5 wt % of the sulfonic acid compound;
    from 0.01 wt % to 5 wt % of the phosphoric acid or the phosphate; and
    a remaining amount of the water.

17. The method for manufacturing a metal pattern of claim 16, wherein:
    the multilayer comprises:
        a first metal layer comprising titanium; and
        a second metal layer disposed on the first metal layer and comprising copper; and
    the etchant composition etches the first metal layer and the second metal layer in a batch.

18. A method for manufacturing an array substrate, the method comprising:
    forming a gate line and a gate electrode, which is connected with the gate line, on a substrate;
    forming a data line, which crosses the gate line in an insulation state, a source electrode, which is connected with the data line, and a drain electrode, which is separated from the source electrode; and
    forming a pixel electrode, which is connected with the drain electrode,
wherein:
    the forming of the gate line and the gate electrode, which is connected with the gate line, comprises:
        forming a photosensitive layer pattern on a multilayer comprising titanium and copper;
        providing an etchant composition on the multilayer on which the photosensitive layer pattern is formed; and
        removing the photosensitive layer pattern;
    the etchant composition comprises a persulfate, a four-nitrogen ring compound, a carbonyl ring compound having two or more carbonyl groups, and water, and a weight ratio of the four-nitrogen ring compound and the carbonyl ring compound is in a range from 1:0.1 to 1:2;
    the etchant composition further comprises a three-nitrogen ring compound having a thiol group, a hydrogen sulfate, a fluorine compound, a sulfonic acid compound, and phosphoric acid or a phosphate; and
    the etchant composition comprises, based on a total amount of the etchant composition:
        from 5 wt % to 20 wt % of the persulfate;
        from 0.1 wt % to 2 wt % of the four-nitrogen ring compound;
        from 0.01 wt % to 3 wt % of the carbonyl ring compound;
        from 0.01 wt % to 2 wt % of the fluorine compound;
        from 0.01 wt % to 1 wt % of the three-nitrogen ring compound;
        from 0.1 wt % to 5 wt % of the hydrogen sulfate;
        from 0.1 wt % to 5 wt % of the sulfonic acid compound;
        from 0.01 wt % to 5 wt % of the phosphoric acid or the phosphate; and
    a remaining amount of the water.

* * * * *